US010455685B1

(12) United States Patent
Klein et al.

(10) Patent No.: US 10,455,685 B1
(45) Date of Patent: Oct. 22, 2019

(54) ELECTRONIC DEVICE, SOCKET, AND SPACER TO ALTER SOCKET PROFILE

(71) Applicant: Intel Corporation, Santa Clara, CA (US)

(72) Inventors: Steven A. Klein, Chandler, AZ (US); Kuang Liu, Queen Creek, AZ (US); Thomas A. Boyd, Vancouver, WA (US); Luis Gil Rangel, Hillsboro, OR (US); Muffadal Mukadem, Portland, OR (US); Shelby A. Ferguson, Winters, CA (US); Francis Toth, Jr., Cornelius, OR (US); Eric Buddrius, Hillsboro, OR (US); Ralph V. Miele, Hillsboro, OR (US); Sriram Srinivasan, Chandler, AZ (US); Jeffory L. Smalley, East Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/159,840

(22) Filed: Oct. 15, 2018

(51) Int. Cl.
| | |
|---|---|
| *H01L 23/522* | (2006.01) |
| *H01L 23/485* | (2006.01) |
| *H01L 23/32* | (2006.01) |
| *H05K 1/02* | (2006.01) |
| *H05K 3/30* | (2006.01) |
| *H01R 12/70* | (2011.01) |
| *H05K 7/10* | (2006.01) |
| *H01L 23/367* | (2006.01) |
| *H05K 3/36* | (2006.01) |

(52) U.S. Cl.
CPC .......... *H05K 1/0201* (2013.01); *H01L 23/32* (2013.01); *H01L 23/3675* (2013.01); *H01L 23/485* (2013.01); *H01L 23/522* (2013.01); *H01R 12/7076* (2013.01); *H05K 3/301* (2013.01); *H05K 3/368* (2013.01); *H05K 7/10* (2013.01); *H05K 2201/066* (2013.01)

(58) Field of Classification Search
CPC ..... H01L 23/32; H01L 23/485; H01L 23/522; H01L 23/3675; H05K 1/0201; H05K 3/301; H05K 3/368; H05K 7/10; H05K 2201/066; H01R 12/7076
See application file for complete search history.

(56) References Cited

U.S. PATENT DOCUMENTS

| | | | | |
|---|---|---|---|---|
| 3,777,052 A * | 12/1973 | Fegen | ................... | F16B 21/082 174/138 D |
| 3,971,127 A * | 7/1976 | Giguere | ................. | H05K 1/189 29/827 |
| 4,200,900 A * | 4/1980 | McGeorge | ............. | H05K 1/141 174/138 D |

(Continued)

*Primary Examiner* — Adrian S Wilson
(74) *Attorney, Agent, or Firm* — Schwegman Lundberg & Woessner, P.A.

(57) ABSTRACT

An electronic device may include a circuit board, and the circuit board may include a dielectric material. A socket may be coupled to a first side of the circuit board, and the socket may be configured to receive a semiconductor package. A backing plate may be positioned on a second side of the circuit board. A spacer may be positioned between the backing plate and the circuit board. The spacer may alter the profile of the socket to provide a curved profile to the socket. The spacer may displace a portion of the socket in a first direction, for instance when the spacer is coupled between the backing plate and the circuit board.

20 Claims, 5 Drawing Sheets

(56) References Cited

U.S. PATENT DOCUMENTS

| | | | | |
|---|---|---|---|---|
| 4,609,240 | A * | 9/1986 | Pistor | H05K 1/117 439/259 |
| 4,918,571 | A * | 4/1990 | Grabbe | H01L 23/04 174/16.3 |
| 5,182,632 | A * | 1/1993 | Bechtel | H01L 23/3675 257/713 |
| 6,043,990 | A * | 3/2000 | Johnson | H05K 3/3436 228/180.22 |
| 6,270,356 | B1 * | 8/2001 | Hoshino | H05K 1/141 439/70 |
| 6,304,450 | B1 * | 10/2001 | Dibene, II | G06F 1/18 165/185 |
| 6,460,170 | B1 * | 10/2002 | Shaeffer | H01R 9/096 257/2 |
| 9,603,287 | B1 * | 3/2017 | Chien | H05K 3/0061 |
| 2003/0057575 | A1 * | 3/2003 | Gektin | H01L 23/10 257/797 |
| 2014/0092547 | A1 * | 4/2014 | Boyd | H05K 3/301 361/679.32 |
| 2016/0183374 | A1 * | 6/2016 | Prakash | H01L 23/00 361/719 |

* cited by examiner

ELECTRONIC DEVICE, SOCKET, AND SPACER TO ALTER SOCKET PROFILE

BACKGROUND

Electronic devices may include a socket. The socket may be coupled to a circuit board. The socket may be configured to couple with a semiconductor package (e.g., a central processing unit).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
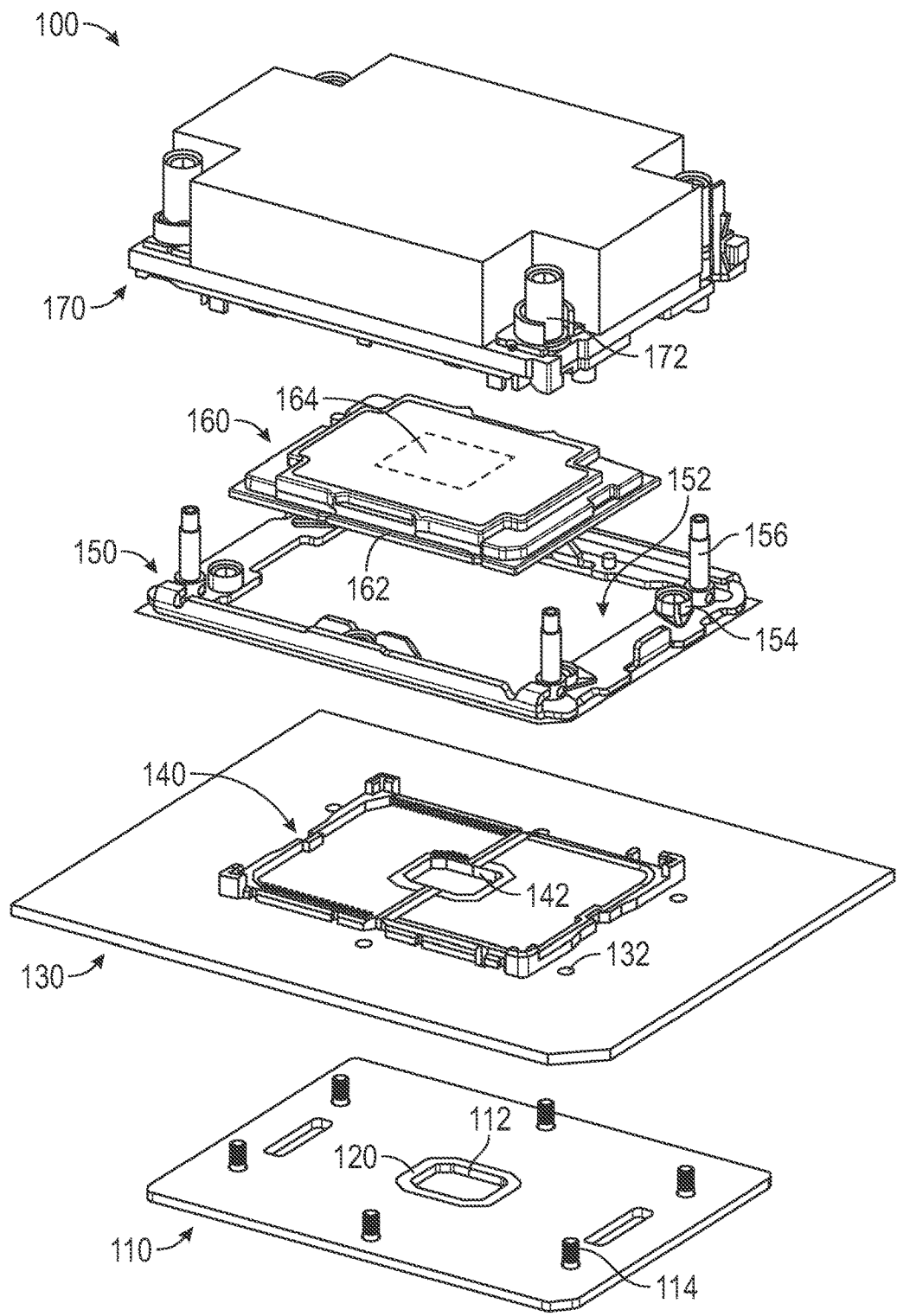
FIG. 1 illustrates an exploded view of one example of an electronic device.

The present inventors have recognized, among other things, that a problem to be solved may include improving the electrical interconnection between components of an electronic device. Additionally, the present inventors have recognized, among other things, that a problem to be solved may include reducing the occurrence of open circuits between a semiconductor package and a socket configured to receive the semiconductor package. The present subject matter may help provide a solution to this problem, such as by improving the planarity of the components of an electronic device.

In an example, an electronic device may include a circuit board, and the circuit board may include a dielectric material. A socket may be coupled to a first side of the circuit board, and the socket may be configured to receive a semiconductor package. A backing plate may be positioned on a second side of the circuit board. A spacer may be positioned between the backing plate and the circuit board. The spacer may alter the profile of the socket to provide a curved profile to the socket. Additionally, the spacer may alter the profile of the circuit board to provide a curved profile to the circuit board. The spacer may displace a portion of the socket in a first direction, for instance when the spacer is coupled between the backing plate and the circuit board. Further, the spacer may displace a portion of the circuit board in the first direction.

In some examples, when the semiconductor package is coupled with the socket, a portion of the socket (or a portion of the circuit board) may displace, for example in a second direction. The second direction may be opposite to the first direction. The displacement of the socket (or the circuit board) may reduce the planarity of the socket or the circuit board. For instance, because the planarity of socket or the circuit board is reduced, a gap may exist between a portion of the socket and the semiconductor package. The reduced planarity of the socket or the circuit board may cause one or more open circuits to exist between the socket and the semiconductor package.

As discussed herein, the spacer may provide a curved profile to the socket or the circuit board. The spacer may improve the planarity of the socket when the semiconductor package is coupled to the socket, and an enabling load applied to the semiconductor package displaces the socket. For instance, the spacer may reduce (e.g., counteract) the displacement of the socket (or the circuit board) in the second direction, and the spacer may improve the electrical interconnection between the socket and semiconductor package. For example, the spacer may pre-camber the socket (or the circuit board), and the spacer may improve the planarity of the socket (or the circuit board) when the semiconductor package is coupled with the socket. Accordingly, the spacer may improve the performance of electronic device. Additionally, the spacer may reduce the amount of rework or yield loss associated with the manufacturing of the electronic device.

This overview is intended to provide an overview of subject matter of the present patent application. This overview is not intended to provide an exclusive or exhaustive explanation of the invention. The detailed description continues and provides further information about the present patent application.

FIG. 1 illustrates an exploded view of one example of an electronic device 100. The electronic device 100 may include a backing plate 110, a spacer 120, a circuit board 130, a socket 140, a bolster plate assembly 150, a semiconductor package 160, and the electronic device 100 may include a heat sink 170. The socket 140 may be coupled to the circuit board 130 (e.g., on a first side of the circuit board 130). For example, the socket 140 may be physically and electrically coupled to the circuit board 130, and the coupling may provide one or more electrical communication pathways between the circuit board 130 and the socket 140. The circuit board 130 may be a motherboard for the electronic device 100.

The backing plate 110 may define a plate opening 112, and the plate opening 112 may receive one or more components of the electronic device 100 (e.g., a capacitor, an inductor, or the like). Additionally, the socket 140 may define a socket opening 142, and the socket opening 142 may receive one or more components of the electronic device 100. In an example, a land side capacitor of the semiconductor package may be received by the socket opening 142 or the plate opening 112. The plate opening 112 and the socket opening 142 may be substantially aligned. The plate opening 112 and the socket opening 142 may be positioned proximate a central region of the electronic device 100. The central region may be a region proximate a center point (e.g., a geometric midpoint) of the backing plate 110, the circuit board 130, or the socket 140). The spacer 120 may be positioned proximate the plate opening 112. For instance, the spacer 120 may surround the plate opening 112.

The backing plate 110 may improve the rigidity of the electronic device 100. For instance, the backing plate 110 may include a material that is stiff relative to the other components of the electronic device 100. In an example, the backing plate 110 may include a metal material, and the circuit board 130 may include a first dielectric material, for instance a first plastic. In another example, the backing plate 110 may include a metal material, and the socket 140 may include a second dielectric material, for instance a second plastic. The circuit board 130 or the socket 140 may have an elastic modulus that is less than the backing plate 110.

The backing plate 110 may be coupled to the circuit board 130 (or the socket 140), and the backing plate 110 may accordingly improve the rigidity of the electronic device 100. The backing plate 110 may be positioned on a second side of the circuit board. For instance, the backing plate 110 may include one or more plate coupling members 114 (e.g., a threaded stud or the like), and the circuit board 130 may include one or more through holes 132. The one or more through holes 132 may be sized, shaped, aligned, correspond with, or otherwise configured to receive the plate coupling members 114. However, the configuration of the plate coupling members 114 and the through holes 132 may be interchanged or intermixed between the backing plate 110 and the circuit board 130 (e.g., the circuit board 130 may include the plate coupling members 114 or a combination of the plate coupling members 114 and the through holes 132). One or more fasteners may engage with the plate coupling members 114, and thereby couple the backing plate 110 with the circuit board 130.

The spacer 120 may be positioned between the backing plate 110 and the circuit board 130 (or the socket 140), for instance on the second side of the circuit board. As described in greater detail herein, the spacer 120 may alter the profile of the circuit board 130, or alter the profile of the socket 140. The spacer 120 may have a thickness, and the thickness of the spacer 120 may provide a standoff (e.g., a height difference) between the backing plate 110 and the circuit board 130 (or the socket 140). In an example, the spacer 120 may project from the backing plate 110. Accordingly, when the spacer 120 is positioned between the backing plate 110 and the circuit board 130, and the backing plate 110 is coupled with the circuit board 130, the spacer 120 may displace a portion of the circuit board 130 (or the socket 140). The displacement of the circuit board 130 or the socket 140 may alter the profile of the circuit board 130 or the socket 140. For instance, the circuit board 130 may have a curved (e.g., bent, yielded, flexed, cambered, or the like) profile when the spacer 120 is positioned between circuit board 130 and the backing plate 110. Additionally, the socket 140 may have a curved profile because the socket 140 may be coupled to the circuit board 130 and the profile of the socket 140 may correspond with the profile of the circuit board 130.

Figure 4:
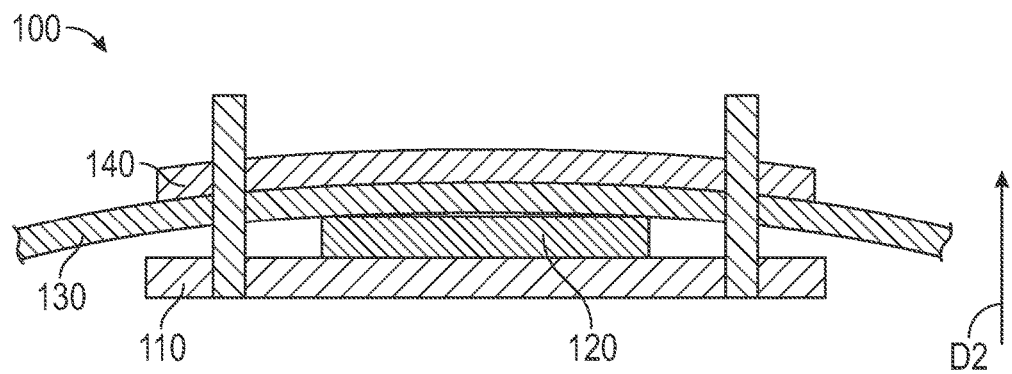
FIG. 4 illustrates a schematic view of one example of an electronic device that includes the spacer of FIG. 2.

In this example, because the backing plate 110 (or the spacer 120) is rigid in comparison to the circuit board 130 (or the socket 140), the backing plate 110 may provide a force to the circuit board 130 (or the socket 140) by reacting against the spacer 120 and alter the profile of the circuit board 130. In an example, the spacer 120 may be positioned in the central region of the electronic device 100. The plate coupling members 114 may be positioned about a peripheral region of the backing plate 110. In this example, when the circuit board 130 is coupled with the backing plate 110, the spacer 120 is positioned in the central region of the electronic device 100, and the spacer 120 is positioned between the backing plate 110 and the circuit board 130, the circuit board 130 (or the socket 140) may have the curved profile (e.g., have a convex shape, as shown in FIG. 4) because the circuit board 130 curves about the spacer 120. Accordingly, a central region of the circuit board 130 (or the socket 140) may be displaced (e.g., in the second direction D2 shown in FIG. 4) relative to a peripheral region of the circuit board 130 (or the socket 140).

Referring again to FIG. 1, the bolster plate assembly 150 may facilitate the coupling of the semiconductor package 160 with the socket 140. For instance, the bolster plate assembly 150 may help provide an enabling load (e.g., a force) to the semiconductor package 160, and the enabling load may facilitate the coupling (e.g., mechanical or electrical coupling) of the semiconductor package 160 with the socket 140. In an example, the bolster plate assembly 150 may couple with the heat sink 170. For instance, the bolster plate assembly 150 may include coupling members 156, and the heat sink 170 may define one or more through holes 172. The coupling members 156 may be received in the through holes 172, and one or more fasteners may engage with the coupling members 156 to thereby couple the heat sink 170 with the bolster plate assembly 150. The heat sink 170 may engage with the semiconductor package 160, and the coupling of the heat sink 170 with the bolster plate assembly 150 may provide the enabling load to couple the semiconductor package 160 with the socket 140.

The bolster plate assembly 150 may be coupled to the circuit board 130. In an example, the bolster plate assembly 150 may define an aperture 152, and the aperture 152 may be configured to receive the socket 140 (e.g., the aperture 152 may be sized and shaped to allow the socket 140 to pass through the bolster plate assembly 150). The aperture 152 may be sized and shaped to allow the semiconductor package 160 to couple with the socket 140. The bolster plate assembly 150 may include one or more through holes 154, and the one or more through holes 154 may be sized, shaped, aligned, correspond with, or otherwise configured to receive the plate coupling members 114. One or more fasteners may engage with the plate coupling members 114 and thereby couple the bolster plate assembly 150 with the backing plate 110 or the circuit board 130. In an example, the circuit board 130 may be positioned between (e.g., sandwiched between) the backing plate 110 and the bolster plate assembly 150.

The semiconductor package 160 may include a package substrate 162, and a semiconductor die 164 may be coupled to the package substrate 162. The package substrate 162 may include one or more package interconnects, and the one or more package interconnects may be sized, shaped, aligned, correspond with, or otherwise configured to engage with one or more socket interconnects. The engagement of the package interconnects with the socket interconnects may electrically couple the semiconductor package 160 with the socket 140. In an example, one or more electrical communication pathways may route signals between the semiconductor die 164 and the circuit board 130 when the semiconductor package 160 is coupled with the socket 140. The semiconductor die 164 may generate heat when operated, and the heat sink 170 may dissipate the heat generated by the semiconductor die 164. The semiconductor die 164 may interface with an integrated heat spreader, and the heat sink 170 may interface with the integrated heat spreader to dissipate heat from the semiconductor die 164.

Figure 2:
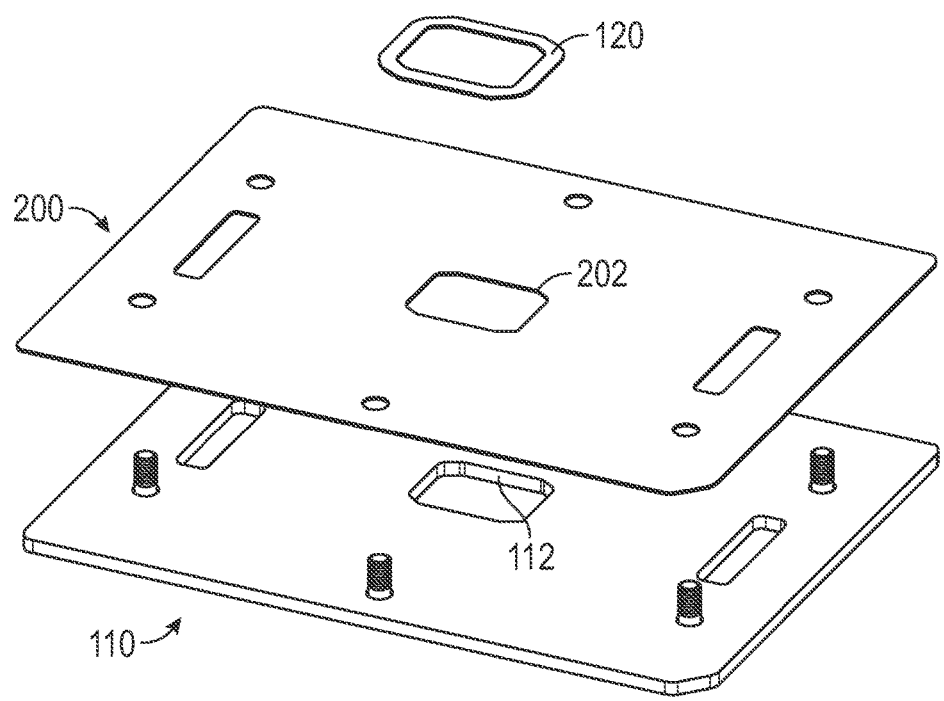
FIG. 2 illustrates an exploded view of one example of a backing plate, an insulator, and a spacer.

FIG. 2 illustrates an exploded view of one example of the backing plate 110, an insulator 200, and the spacer 120. The insulator 200 may electrically isolate the backing plate 110 from other components of the electronic device 100. The insulator 200 may help prevent electrical shorting between components of the electronic device 100. The insulator 200 may define an insulator opening 202. The insulator opening 202 may be aligned with the plate opening 112 and may be aligned with the socket opening 142.

The spacer 120 may be coupled to the insulator 200, for instance with an adhesive. In an example, the spacer 120 may be a sticker that is applied to the insulator 200. The spacer 120 may be positioned proximate the insulator opening 202. As shown in FIG. 2, the spacer may be sized and shaped to surround the insulator opening 202 (or the plate opening 112), however the present subject matter is not so limited.

Figure 3:
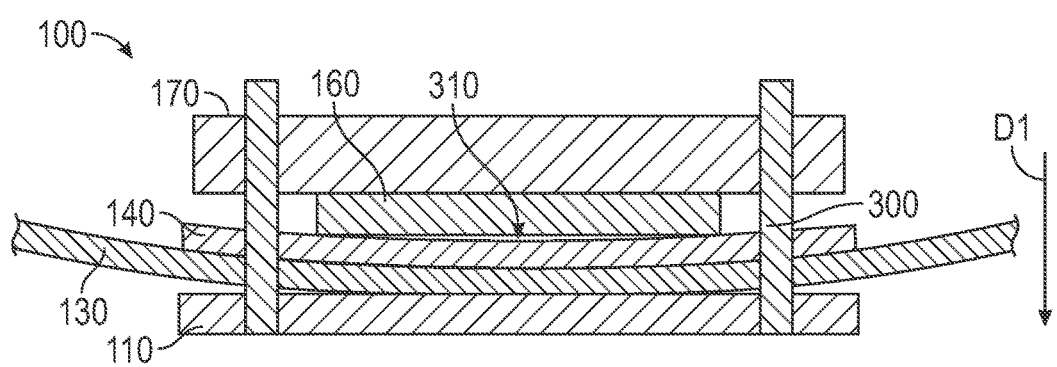
FIG. 3 illustrates a schematic view of one example of an electronic device that does not include the spacer of FIG. 2.

FIG. 3 illustrates a schematic view of one example of the electronic device 100 that does not include the spacer 120 of FIG. 2. As described herein, the backing plate 110 may be coupled with the circuit board 130. In an example, one or more coupling members 300 may extend through the backing plate 110 and the circuit board 130. Optionally, the coupling members may extend through the socket 140 or the heat sink 170. One or more fasteners may engage with the coupling members 300 and thereby couple the backing plate 110, the circuit board 130, and the heat sink 170.

The coupling of the heat sink 170 with the coupling members 300 may facilitate the coupling of the semiconductor package 160 with the socket 140. For instance, the heat sink 170 may engage with the semiconductor package 160 to provide an enabling load to the semiconductor package 160. As shown in FIG. 3, the enabling load may displace the socket 140 or the circuit board 130 in a first direction D1. The displacement of the socket 140 or the circuit board 130 in the first direction D1 is exaggerated in FIG. 3 for clarity. The displacement of the socket 140 (or the circuit board 130) may reduce the planarity of the socket 140 or the circuit board 130 (e.g., the circuit board 130 or the socket 140 may be concave in shape). In this example, because the planarity of socket or the circuit board is reduced, a gap 310 may exist between a portion of the socket 140 and the semiconductor package 160. The reduced planarity of the socket 140 or the circuit board 130 may cause one or more open circuits to exist between the socket 140 and the semiconductor package 160.

FIG. 4 illustrates a schematic view of one example of the electronic device 100 that includes the spacer 120 of FIG. 2. As described herein, the spacer 120 may be positioned between the backing plate 110 and the circuit board 130. The spacer 120 may alter the profile of the circuit board 130 or the socket 140, and the spacer 120 may provide a curved profile to the circuit board 130 or the socket 140. For instance, the spacer 120 may displace the socket 140 (or the circuit board 130) in a second direction D2. The displacement of the socket 140 or the circuit board 130 in the second direction D2 is exaggerated in FIG. 4 for clarity. In an example, because the spacer 120 provides a curved profile to the socket 140 or the circuit board 130, the displacement (e.g., in the first direction D1) of the socket 140 may be reduced (e.g., counteracted) when the semiconductor package 160 is coupled to the socket 140 (e.g., when an enabling load is applied to the semiconductor package 160). The curved profile of the socket 140 may be different than the curved profile of the circuit board 130 (e.g., the socket 140 may bend less than the circuit board 130, for instance due to different mechanical properties between the socket 140 and the circuit board).

As shown in FIG. 4, the spacer 120 may provide a curved profile to the socket 140 (e.g., pre-camber the socket 140 or make the socket 140 convex in shape). The spacer 120 may improve the planarity of the socket 140 (or the circuit board 130) when the semiconductor package 160 (shown in FIG. 1) is coupled with the socket 140. Accordingly, the electrical interconnection between the socket 140 and semiconductor package 160 may be improved. Additionally, the spacer 120 may improve the performance of electronic device 100. Further, the spacer 120 may reduce the amount of rework or yield loss associated with the manufacturing of the electronic device 100.

Figure 5:
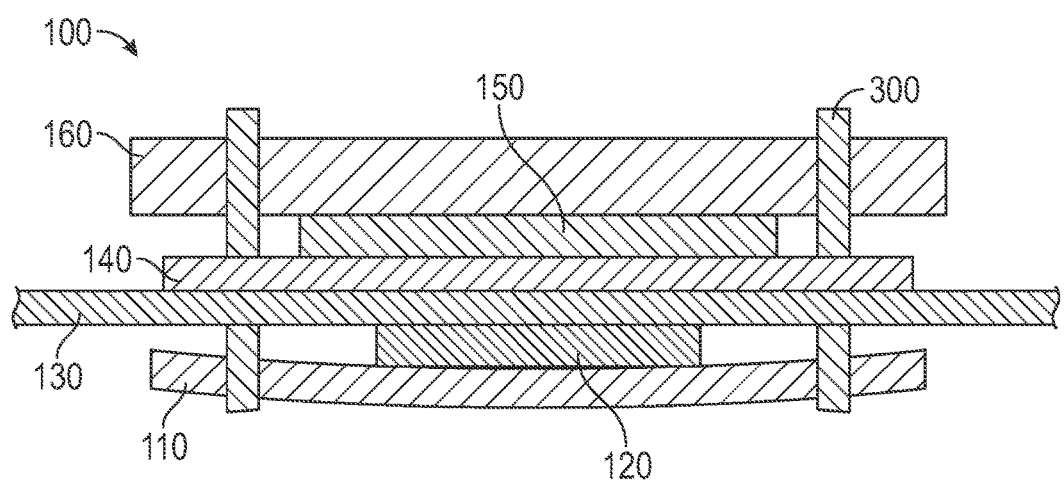
FIG. 5 illustrates a schematic view of the electronic device of FIG. 1.

FIG. 5 illustrates a schematic view of the electronic device 100 of FIG. 1. As discussed herein, the spacer 120 may improve the planarity of the socket 140 or the circuit board 130. For instance, the coupling members 300 may facilitate the coupling of the heat sink 170 with the electronic device 100 and provide an enabling load to the semiconductor package 160. In this example (and as described with reference to FIG. 3), when the heat sink 170 is coupled with the electronic device 100, the circuit board 130 or the socket 140 may be displaced in the first direction D1. The spacer 120 displaces the circuit board 130 or the socket 140 in the second direction D2 (shown in FIG. 4), and the displacement in the second direction D2 provided by the spacer 120 may counteract the displacement in the first direction D1 provided by the enabling load.

As shown in FIG. 5, the planarity of the circuit board 130 or the socket 140 is improved (e.g., when the electronic device 100 includes the spacer 120, the circuit board 130 or the socket 140 are substantially planar when the semiconductor package 160 is coupled with the socket 140). Additionally, because the planarity of the circuit board 130 or the socket 140 is improved, the gap 310 (shown in FIG. 3) between the semiconductor package 160 and the socket 140 may be reduced. The improved planarity may facilitate the coupling of the semiconductor package 160 with the socket 140 and thereby reduce open circuits between the semiconductor package 160 and the socket 140. Accordingly, the spacer 120 helps improve the performance of the electronic device 100.

The coupling of the semiconductor package 160 with the socket 140 or with the circuit board 130 may include displacing the backing plate 110 (e.g., in the first direction D1). The coupling of the semiconductor package 160 with the socket 140 or with the circuit board 130 may provide the backing plate 110 with a curved profile. The backing plate 110 may have a curved profile because the enabling load may displace a portion of the backing plate 110.

Figure 6:
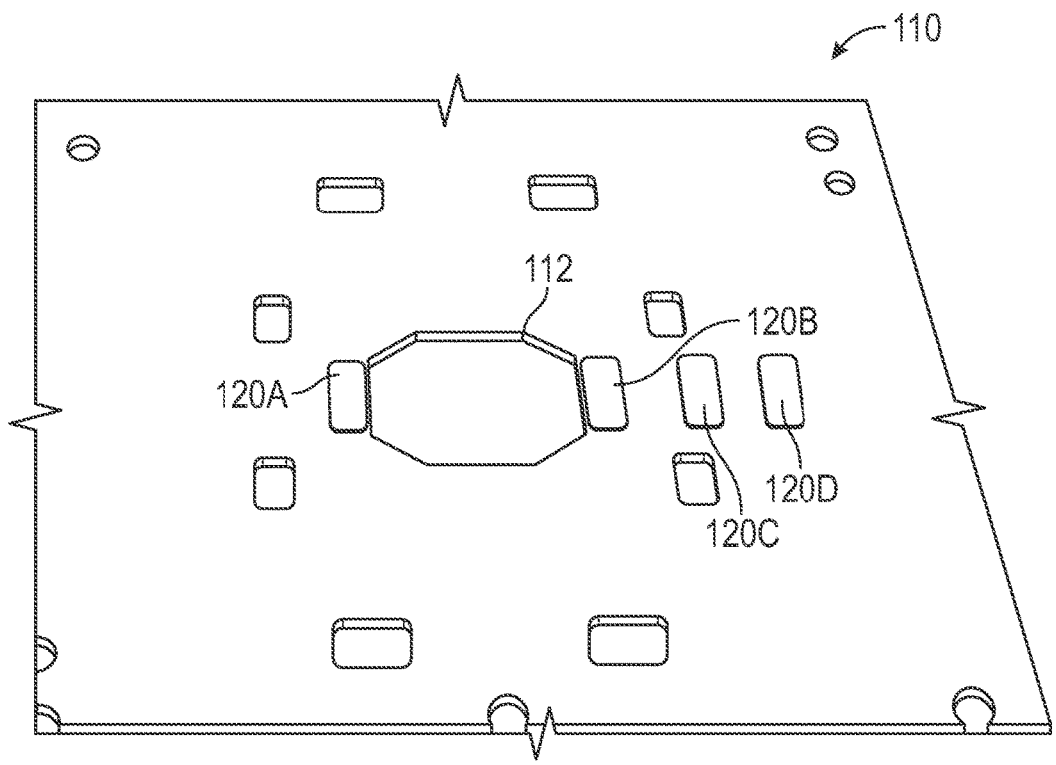
FIG. 6 illustrates a perspective view of another example of a backing plate and another example of a spacer.

FIG. 6 illustrates a perspective view of another example of the backing plate 110 and another example of the spacer 120. As described herein, spacer 120 may surround a periphery of the plate opening 112, but the present subject matter is not so limited. For instance, the spacer 120 may include a first spacer portion 120A and a second spacer portion 120B. The spacer portions 120A, 120B may be positioned proximate the central region of the backing plate 110. The spacer portions 120A, 120B may be positioned proximate the plate opening 112. For instance, the spacer portion 120A may be positioned on a first side of the plate opening 112, and the spacer portion 120B may be positioned on a second side of the plate opening 112. The spacer portions 120A, 120B may be selectively positioned to alter the profile of the circuit board 130 or the socket 140. In an example, the spacer portions 120A, 120B may be separated (e.g, spaced) at a first dimension (e.g., distance). In another example, the spacer portions 120A, 120B may be positioned in a grid, a row, or in an irregular pattern.

Additionally, a height (e.g., thickness) of the spacer portions 120A, 120B may be variable. For instance, the spacer portion 120A may have a different height than the spacer portion 120B. In another example, the spacer portion 120A may be sloped (e.g., configured as an inclined plane). The variable height of the spacer portions 120A, 120B may alter the profile as desired (e.g., to fine-tune the displacement of the socket 140 in the second direction D2, shown in FIG. 4). In another example, a third spacer portion 120C and a fourth spacer portion 120D may be arranged in a row with the spacer portion 120B. The spacer portions 120B, 120C, 120D may be stepped in height, where the height of the spacer portion 120B is greater than the spacer portion 120C, and the spacer portion 120C is greater in height than the spacer portion 120D.

Figure 7:
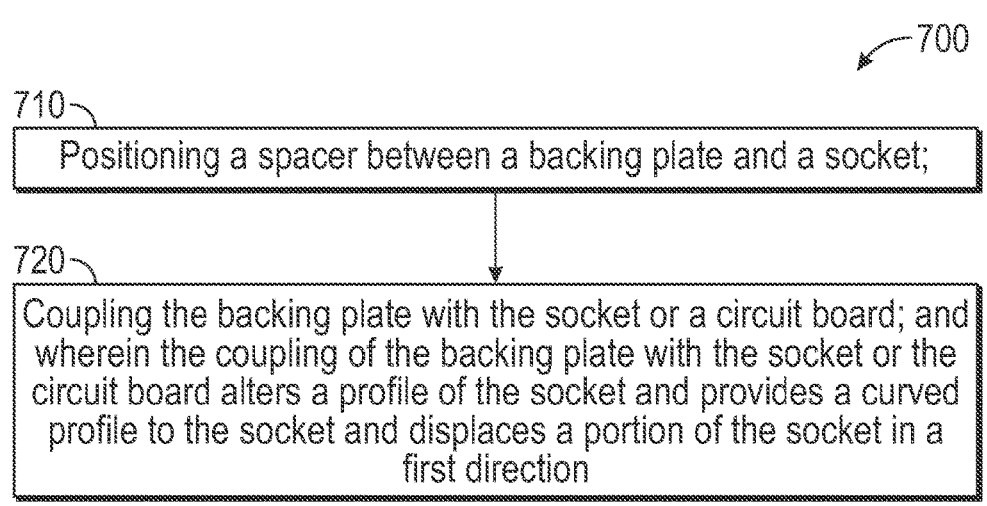
FIG. 7 shows one example of a method for manufacturing the electronic device of FIG. 1.

FIG. 7 shows one example of a method 700 for manufacturing an electronic device, including one or more of the electronic device 100 described herein. In describing the method 700, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 700 include, but are not limited to, the corresponding numbered elements provided herein and other corresponding elements described herein (both numbered and unnumbered) as well as their equivalents.

At 710, a spacer 120 may be positioned between a backing plate 110 and a socket 140. The spacer 120 may be positioned proximate a central region of the circuit board or the socket. The spacer 120 may be positioned proximate a socket opening 142 that may be defined in the socket 140. The socket opening 142 may extend through a thickness of socket 140.

At 720, the method 700 may include coupling the backing plate 110 with the socket 140 or a circuit board 130. The coupling of the backing plate 110 with the socket 140 or the circuit board 130 may alter a profile of the socket 140. The coupling of the backing plate 110 with the socket 140 or the circuit board 130 may provide a curved profile to the socket 140, and may displace a portion of the socket 140 (e.g., in the first direction D2, shown in FIG. 4). The coupling of the backing plate 110 with the socket 140 or the circuit board 130 may provide a curved profile to the circuit board 130, and may displace a portion of the circuit board (e.g., in the second direction).

Several options for the method 700 follow. In an example, a semiconductor package 160 may be coupled with the socket 140 or with the circuit board 130. The coupling of the semiconductor package 160 to the socket 140 or the circuit board 130 decreases the curved profile of the socket 140, and displaces the socket 140 (e.g., in the first direction D1, shown in FIG. 3). The displacement associated with the coupling of the semiconductor package 160 to the socket 140 or the circuit board 130 may be opposite to the displacement provided by the spacer 120. In another example, the coupling of the semiconductor package 160 with the socket 140 or with the circuit board 130 may include displacing the backing plate 110 (e.g., in the first direction D1). The coupling of the semiconductor package 160 with the socket 140 or with the circuit board 130 may provide the backing plate 110 with a curved profile.

Figure 8:
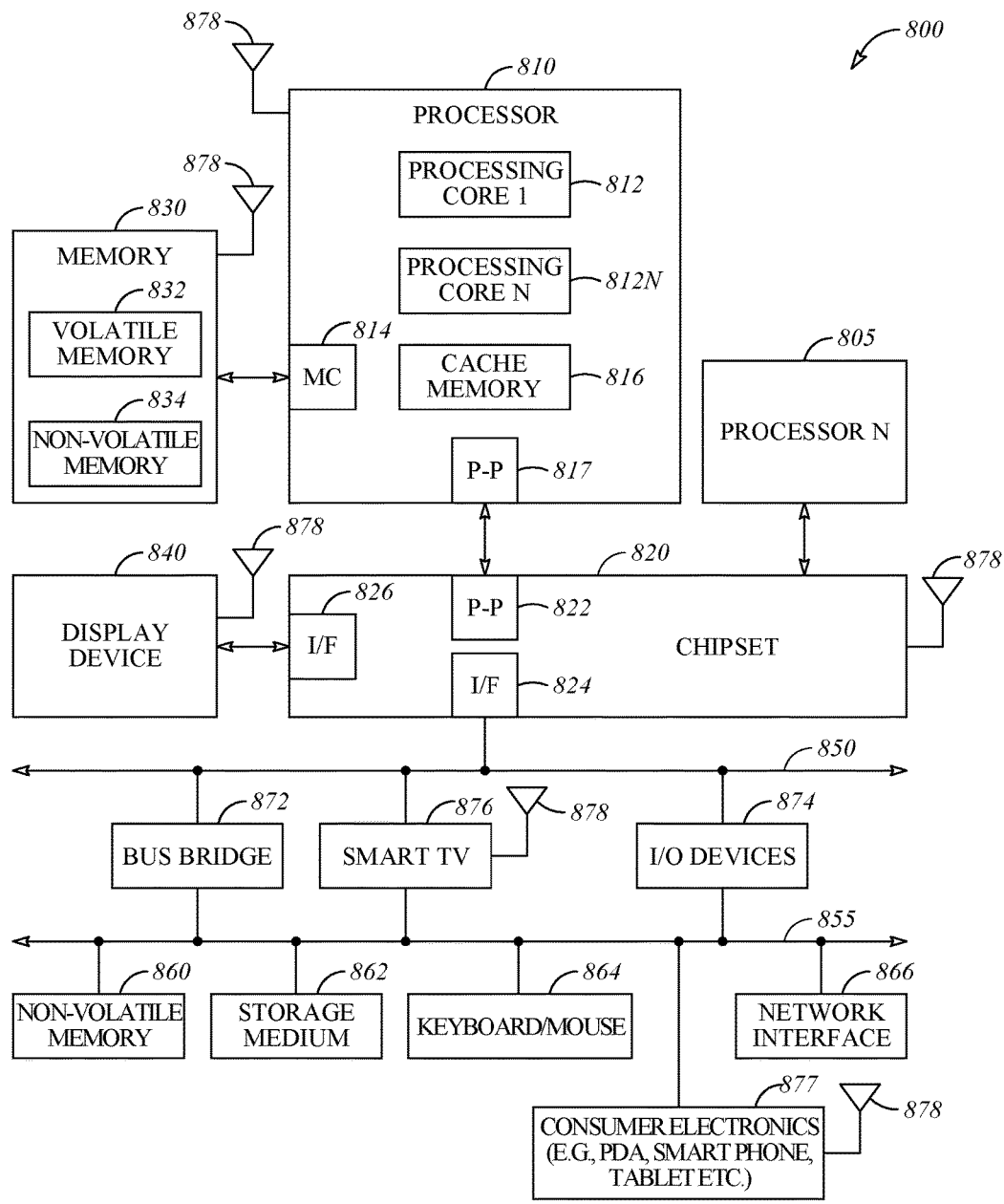
FIG. 8 illustrates a system level diagram, depicting an example of a third electronic device (e.g., system).

FIG. 8 illustrates a system level diagram, depicting an example of an electronic device (e.g., system) including the electronic device 100 as described in the present disclosure. FIG. 8 is included to show an example of a higher-level device application for the electronic device 100. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT)

display, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) may be incorporated into processor core 812.

VARIOUS NOTES & EXAMPLES

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a circuit board including a dielectric material; a socket coupled to a first side of the circuit board and the socket is configured to receive a semiconductor package; a backing plate positioned on a second side of the circuit board; a spacer positioned between the backing plate and the circuit board; and wherein the spacer alters a profile of the socket to provide a curved socket profile to the socket and displaces a portion of the socket in a first direction when the spacer is coupled between the backing plate and the circuit board.

Aspect 2 may include or use, or may optionally be combined with the subject matter of Aspect 1, to optionally include or use a bolster plate assembly coupled with the circuit board, wherein the bolster plate assembly defines an aperture, and the aperture is sized and shaped to receive the socket.

Aspect 3 may include or use, or may optionally be combined with the subject matter of Aspect 2 to optionally include or use wherein the bolster plate assembly has a curved bolster profile.

Aspect 4 may include or use, or may optionally be combined with the subject matter of one or any combination of Aspects 1 through 3 to optionally include or use wherein the circuit board has a curved board profile.

Aspect 5 may include or use, or may optionally be combined with the subject matter of one or any combination of Aspects 1 through 4 to optionally include or use an insulator coupled with the backing plate, wherein the spacer is coupled with the insulator and the spacer projects from a surface of the insulator.

Aspect 6 may include or use, or may optionally be combined with the subject matter of one or any combination of Aspects 1 through 5 to optionally include or use wherein the spacer substantially surrounds a periphery of an opening in the backing plate.

Aspect 7 may include or use, or may optionally be combined with the subject matter of one or any combination of Aspects 1 through 6 to optionally include or use wherein the spacer is a first spacer and further comprising a second spacer, and the first spacer is separated from the second spacer by a first dimension.

Aspect 8 may include or use, or may optionally be combined with the subject matter of one or any combination of Aspects 1 through 7 to optionally include or use wherein the spacer is positioned proximate a central region of the backing plate or the socket.

Aspect 9 may include or use, or may optionally be combined with the subject matter of one or any combination of Aspects 1 through 8 to optionally include or use wherein the circuit board is a motherboard.

Aspect 10 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a semiconductor package including a semiconductor die; a circuit board including a dielectric material; a socket coupled to a first side of the circuit board and the socket is configured to receive the semiconductor package; a backing plate positioned on a second side of the circuit board; a spacer positioned between the backing plate and the circuit board; and wherein the semiconductor package is received by the socket and is coupled with the socket, and the backing plate has a curved profile, and the curved profile of the backing plate provides a force to the socket by reacting against the spacer.

Aspect 11 may include or use, or may optionally be combined with the subject matter of Aspect 10, to optionally include or use a bolster plate assembly coupled with the circuit board, wherein: the bolster plate assembly is configured to couple with a heat sink; the bolster plate assembly defines an aperture and the aperture is sized and shaped to receive the semiconductor package; and wherein the coupling of the heat sink with the bolster plate assembly provides an enabling load to the semiconductor package and the enabling load couples the semiconductor package with the socket.

Aspect 12 may include or use, or may optionally be combined with the subject matter of Aspect 11 to optionally include or use wherein the heat sink is coupled with the bolster plate assembly, and the coupling of the heat sink with the bolster plate assembly provides the curved profile to the backing plate.

Aspect 13 may include or use, or may optionally be combined with the subject matter of one or any combination of Aspects 11 or 12 to optionally include or use wherein the backing plate defines a plate opening extending through a thickness of the backing plate, and the spacer is positioned proximate the plate opening.

Aspect 14 may include or use subject matter (such as an apparatus, a system, a device, a means for performing acts, or a device readable medium including instructions that, when performed by the device, may cause the device to perform acts, or an article of manufacture), such as may include or use a method for manufacturing an electronic device, comprising: positioning a spacer between a backing plate and a socket; coupling the backing plate with the socket or a circuit board; and wherein the coupling of the backing plate with the socket or the circuit board alters a profile of the socket and provides a curved profile to the socket and displaces a portion of the socket in a first direction.

Aspect 15 may include or use, or may optionally be combined with the subject matter of Aspect 14, to optionally include or use coupling a semiconductor package with the socket or with the circuit board, wherein the coupling of the semiconductor package with the socket or the circuit board decreases the curved profile of the socket, and displaces the socket in a second direction.

Aspect 16 may include or use, or may optionally be combined with the subject matter of Aspect 15 to optionally include or use wherein the second direction is opposite the first direction.

Aspect 17 may include or use, or may optionally be combined with the subject matter of Aspects 15 or 16 to optionally include or use wherein the coupling of the semiconductor package with the socket or with the circuit board includes displacing the backing plate in the second direction, and provides the backing plate with a curved profile.

Aspect 18 may include or use, or may optionally be combined with the subject matter of one or any combination of Aspects 14 through 17 to optionally include or use wherein the coupling of the backing plate with the socket or the circuit board provides a curved profile to the circuit board, and displaces a portion of the circuit board in the first direction.

Aspect 19 may include or use, or may optionally be combined with the subject matter of one or any combination of Aspects 14 through 18 to optionally include or use positioning the spacer proximate a central region of the circuit board or the socket.

Aspect 20 may include or use, or may optionally be combined with the subject matter of one or any combination of Aspects 14 through 19 to optionally include or use positioning the spacer proximate a central region of the socket.

Aspect 21 may include or use, or may optionally be combined with any portion or combination of any portions of any one or more of Aspects 1 through 20 to include or use, subject matter that may include means for performing any one or more of the functions of Aspects 1 through 20, or a machine-readable medium including instructions that, when performed by a machine, cause the machine to perform any one or more of the functions of Aspects 1 through 20.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising:
a circuit board including a dielectric material;
a socket coupled to a first side of the circuit board and the socket is configured to receive a semiconductor package;
a backing plate positioned on a second side of the circuit board;
a spacer positioned between the backing plate and the circuit board; and
wherein the spacer alters a profile of the socket to provide a curved socket profile to the socket and displaces a portion of the socket in a first direction when the spacer is coupled between the backing plate and the circuit board.

2. The electronic device of claim 1, further comprising a bolster plate assembly coupled with the circuit board, wherein the bolster plate assembly defines an aperture, and the aperture is sized and shaped to receive the socket.

3. The electronic device of claim 2, wherein the bolster plate assembly has a curved bolster profile.

4. The electronic device of claim 1, wherein the circuit board has a curved board profile.

5. The electronic device of claim 1, further comprising an insulator coupled with the backing plate, wherein the spacer is coupled with the insulator and the spacer projects from a surface of the insulator.

6. The electronic device of claim 1, wherein the spacer substantially surrounds a periphery of an opening in the backing plate.

7. The electronic device of claim 1, wherein the spacer is a first spacer and further comprising a second spacer, and the first spacer is separated from the second spacer by a first dimension.

8. The electronic device of claim 1, wherein the spacer is positioned proximate a central region of the backing plate or the socket.

9. The electronic device of claim 1, wherein the circuit board is a motherboard.

10. An electronic device, comprising:
a semiconductor package including a semiconductor die;
a circuit board including a dielectric material;
a socket coupled to a first side of the circuit board and the socket is configured to receive the semiconductor package;
a backing plate positioned on a second side of the circuit board;
a spacer positioned between the backing plate and the circuit board; and
wherein the semiconductor package is received by the socket and is coupled with the socket, and the backing plate has a curved profile, and the curved profile of the backing plate provides a force to the socket by reacting against the spacer.

11. The electronic device of claim 10, further comprising a bolster plate assembly coupled with the circuit board, wherein:
the bolster plate assembly is configured to couple with a heat sink;
the bolster plate assembly defines an aperture and the aperture is sized and shaped to receive the semiconductor package; and
wherein the coupling of the heat sink with the bolster plate assembly provides an enabling load to the semiconductor package and the enabling load couples the semiconductor package with the socket.

12. The electronic device of claim 11, wherein the heat sink is coupled with the bolster plate assembly, and the coupling of the heat sink with the bolster plate assembly provides the curved profile to the backing plate.

13. The electronic device of claim 11, wherein the backing plate defines a plate opening extending through a thickness of the backing plate, and the spacer is positioned proximate the plate opening.

14. A method for manufacturing an electronic device, comprising:
positioning a spacer between a backing plate and a socket;
coupling the backing plate with the socket or a circuit board; and
wherein the coupling of the backing plate with the socket or the circuit board alters a profile of the socket and provides a curved profile to the socket and displaces a portion of the socket in a first direction.

15. The method of claim 14, further comprising:
coupling a semiconductor package with the socket or with the circuit board, wherein the coupling of the semiconductor package with the socket or the circuit board decreases the curved profile of the socket, and displaces the socket in a second direction.

16. The method of claim 15, wherein the second direction is opposite the first direction.

17. The method of claim 15, wherein the coupling of the semiconductor package with the socket or with the circuit board includes displacing the backing plate in the second direction, and provides the backing plate with a curved profile.

18. The method of claim 14, wherein the coupling of the backing plate with the socket or the circuit board provides a curved profile to the circuit board, and displaces a portion of the circuit board in the first direction.

19. The method of claim 14, further comprising positioning the spacer proximate a central region of the circuit board or the socket.

20. The method of claim 14, further comprising positioning the spacer proximate a central region of the socket.

* * * * *